United States Patent [19]

Gudaitis et al.

[11] 4,209,217

[45] Jun. 24, 1980

[54] HOUSING FOR REMOVABLE MOUNTING ON PRINTED CIRCUIT BOARD

[75] Inventors: Bernard V. Gudaitis, Elgin, Ill.; Paul Maximoff, Upland, Calif.

[73] Assignee: Thomas & Betts Corporation, Raritan, N.J.

[21] Appl. No.: 955,239

[22] Filed: Oct. 26, 1978

[51] Int. Cl.$^2$ .................... H05K 1/12

[52] U.S. Cl. .................... 339/75 MP; 339/97 P; 339/125 R; 339/176 MF

[58] Field of Search .................... 339/17 C, 17 CF, 17 F, 339/75 R, 75 M, 75 MP, 91 R, 99 R, 125 R, 128, 176 MP, 176 MF, 97

[56] References Cited

U.S. PATENT DOCUMENTS

| | | | |
|---|---|---|---|
| 3,380,013 | 4/1968 | Krone et al. | 339/97 P |
| 3,744,009 | 7/1973 | Teagno et al. | 339/128 |
| 3,836,885 | 9/1974 | Larsile | 339/125 R |
| 4,009,921 | 3/1977 | Narozny | 339/125 R |

*Primary Examiner*—Neil Abrams
*Attorney, Agent, or Firm*—James J. Daley; Jesse Woldman

[57] ABSTRACT

A connector for a printed circuit board has a base and a cover movably mounted thereon. A depending portion of the base cooperates with a depending portion of the cover to removably mount the connector on the printed circuit board. The connector is adapted to receive an electrical contact having a number of insulation-displacing slots, each of which is offset with respect to at least one adjacent slot.

17 Claims, 6 Drawing Figures

HOUSING FOR REMOVABLE MOUNTING ON PRINTED CIRCUIT BOARD

FIELD OF THE INVENTION

The present invention relates to electrical connector and contact assemblies, and, more particularly, to such assemblies which are especially adapted for use with printed circuit boards.

BACKGROUND OF THE INVENTION

One of the earliest devices for connecting an electrical cable to a surface conductor of a printed circuit board employed a socket connector adapted for attachment to a pin or header soldered into the printed circuit board. These early devices were both expensive and time-consuming to install.

More recently, connector assemblies have been developed which overcome the problems and disadvantages of the early devices discussed above. For instance, Teagno et al. U.S. Pat. No. 3,744,009 describes and illustrates a more recent type of printed circuit board connector assembly which utilizes rigid leg members attached to a stationary housing, each of the leg members registering with a corresponding aperture in a printed circuit board for mounting the connector assembly thereon. Due to the rigidity of the leg members, the housing must be slid along the printed circuit board to properly latch the housing in position. Sliding the housing along the printed circuit board is undesirable, because a contact carried by the housing rubs against a surface conductor on the printed circuit board, thereby causing undue wear of the surface conductor and a resulting rapid deterioration of the electrical juncture between the contact and the surface conductor.

In order to reduce such wear, the connector assemblies disclosed in Narozny U.S. Pat. No. 4,009,921 were developed by the assignee of this application. The connector assemblies of the Narozny patent include two pairs of resilient leg members which are attached to a body portion of the connector assemblies, each of the leg members terminating in a foot adapted for insertion through a corresponding aperture in a printed circuit board. The feet of at least one pair of the legs can be deflected to permit them to pass through their corresponding apertures. The resilient leg members and the deflectable feet permit the connector assemblies to be pivoted or pushed into position. By pivoting or pushing the connector assemblies into position, it is possible to avoid the wear generally resulting from the use of the connector assemblies, like the one disclosed in the Teagno et al. patent, which are mounted on a printed circuit board by sliding them into position. Despite the substantial advantages of the connector assemblies described and illustrated in the Narozny patent, their mounting and removal are complicated by the need to manually engage at least one pair of the leg members or feet to deflect the individual leg members or feet into proper positions with respect to the corresponding apertures in the printed circuit board.

In the past, electrical contacts for printed circuit boards have employed a number of aligned insulation-displacing slots designed to displace the insulation of an insulated conductor. However, when such conductors are made from a bundle of individual strands of conducting material, the outer strands tend to become somewhat realigned and compressed toward the medial longitudinal axes of the slots, thereby disadvantageously reducing the quality of the electrical connection between the contacts and the conductor. A contact having aligned insulation-piercing slots, which are similar to the insulation-displacing slots discussed above, is disclosed in the Narozny patent.

SUMMARY OF THE INVENTION

Many of the disadvantages and shortcomings of the connector assemblies and contacts discussed above are overcome by the present invention which includes a new and improved connector and contact adapted for use with printed circuit boards. The connector includes a base mounted on the top side of a printed circuit board and having a depending portion extending from the top side of the printed circuit board to the underside thereof. A cover movably mounted with respect to the base has a depending portion which can be moved through an opening in the printed circuit board in response to the movement of the cover for releasably engaging the underside of the printed circuit board. The depending portion of the base engages the underside of the printed circuit board and cooperates with the depending portion of the cover to releasably mount the connector in a fixed position on the top side of the printed circuit board. Inasmuch as the connector can be locked in position and unlocked simply by moving the cover, which is more readily accessible than any members depending from the base, mounting and removal of the connector are greatly facilitated.

In one especially advantageous embodiment, the cover is pivotally mounted to the base for pivotal movement between an open position and a closed position. The cover can be releasably maintained in the closed position by a catch which is positioned on the base so as to releasably engage the cover when it is closed.

The depending portion of the cover may consist of a pair of arcuate hooks, each of which is movable through a corresponding opening in the printed circuit board. To provide a mid-board connector, the depending portion of the base may consist of another pair of arcuate hooks, each of the hooks extending through a corresponding opening in the printed circuit board. Alternatively, in an edge board connector version of the present invention, the depending portion of the base is a single L-shaped hook adapted for attachment to an exterior edge of the printed circuit board.

The connector may receive the new and improved contact of the present invention which includes a plurality of insulation-displacing slots arranged successively therealong. Each of the slots is offset with respect to at least one adjacent slot, so that an insulated electrical conductor inserted into the slots will be bent a number of times to follow a tortuous path defined by the slots. The contact may be designed to tension the conductor, so that, if the conductor is made from a bundle of individual strands of electric-conducting material wrapped by a layer of electric-insulating material, displacement of the individual strands will be inhibited to provide a good electrical connection between the conductor and contact.

In one novel embodiment, the contact includes a flat elongated body having an upstanding bridge extending outwardly from the upper surface thereof. The upper surface of the bridge contains four insulation-displacing slots arranged in such a manner that the two end slots lie along a common centerline and the two other slots lie along another common centerline. A deflectable locking tang may be arranged on the body so as to cooperate with a stationary abutment in the connector for inhibiting inadvertent removal of the contact from the connector.

BRIEF DESCRIPTION OF THE DRAWINGS

For a more complete understanding of the invention, reference may be had to the following description of the exemplary embodiments taken in conjunction with the accompanying figures of the drawings, in which.

DESCRIPTION OF THE EXEMPLARY EMBODIMENTS

Figure 1:
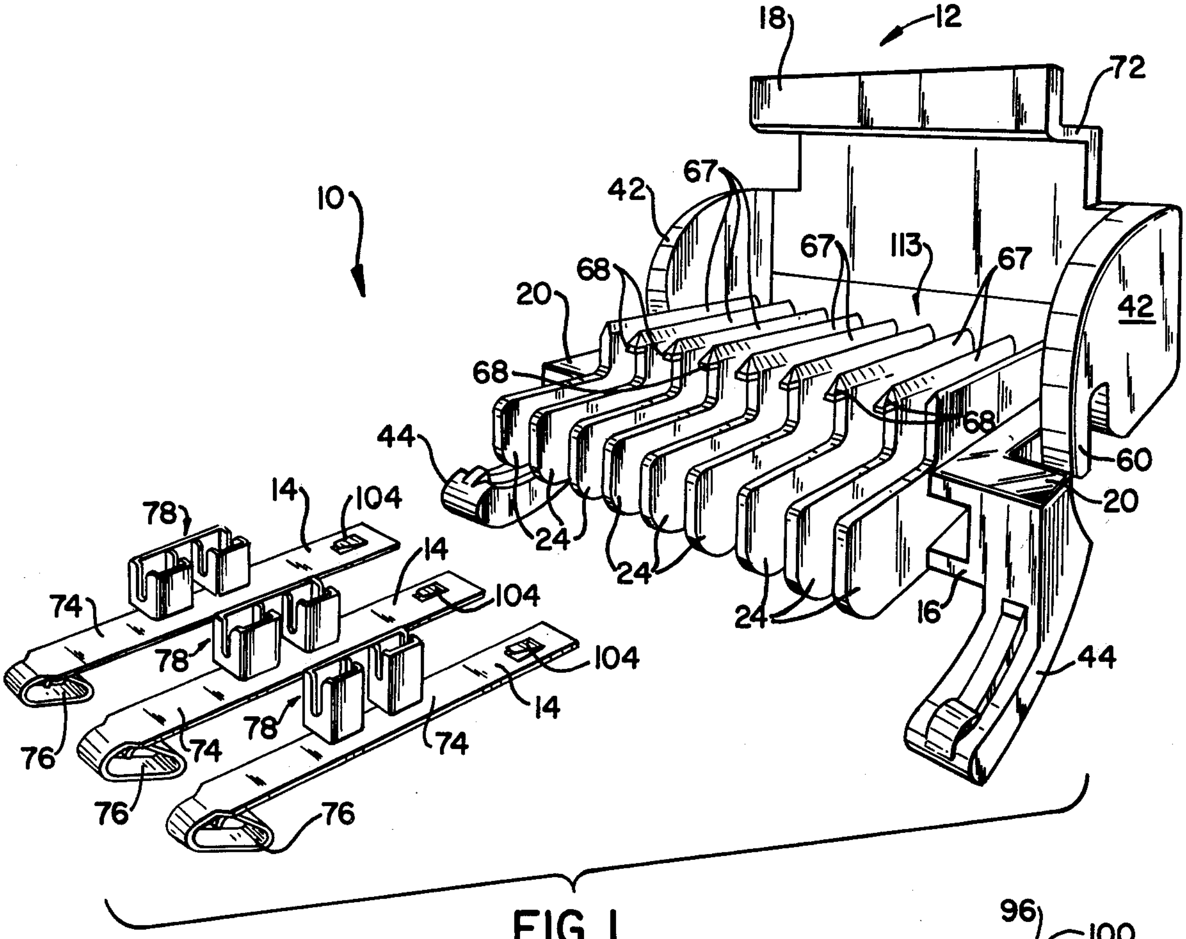
FIG. 1 is an exploded perspective view of a connector and contact assembly constructed in accordance with one embodiment of the present invention.
Figure 3:
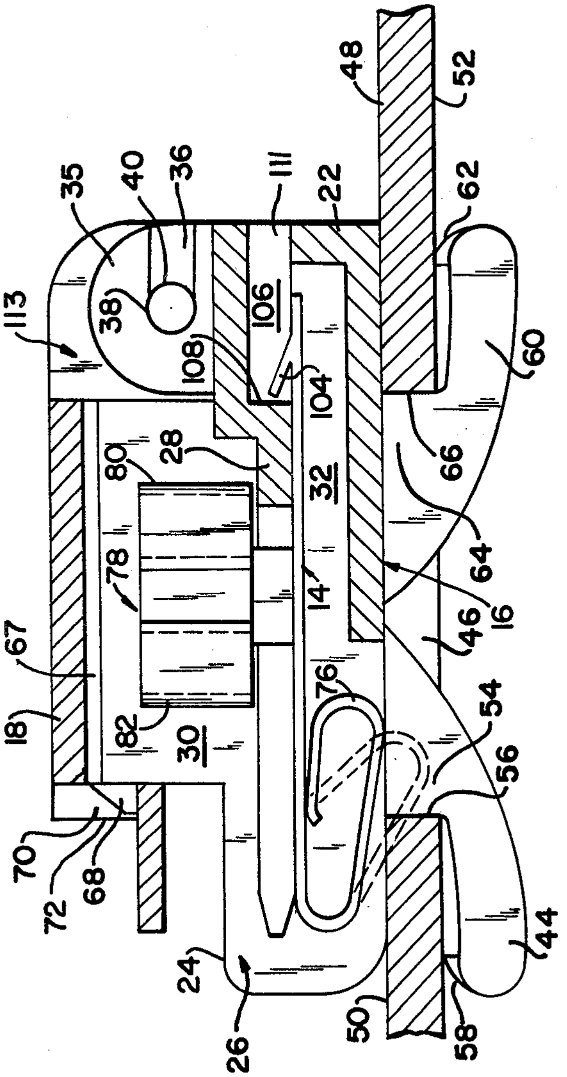
FIG. 3 is a longitudinal cross-sectional view of the connector and contact assembly of FIGS. 1 and 2.
Figure 2:
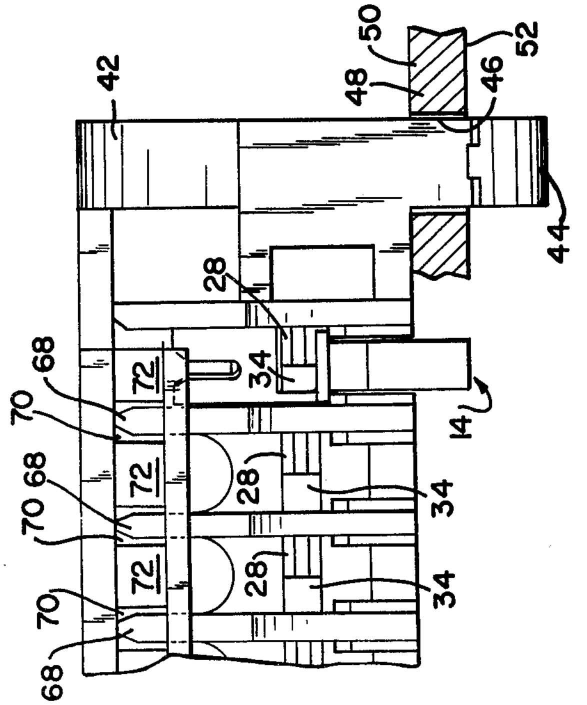
FIG. 2 is a partial back elevational view of the connector and contact assembly shown in FIG. 1.

The connector and contact assembly 10 illustrated in FIGS. 1-3 includes a connector 12 made from a plastic material and a plurality of contacts 14 made from a good electric-conducting material, such as a copper alloy. The connector 12 includes a base 16 and a cover 18 pivotally mounted thereto. The base 16 has a pair of vertical sidewalls 20 and a front wall 22. A plurality of vertical partitions 24 are spaced equidistantly across the base 16 to form a number of channels 26. Each of the channels 26 includes a horizontal dividing wall 28 which divides the channel 26 into an upper channel 30 and a lower channel 32. A slot 34 in the rear end of the dividing wall 28 permits each of the chambers 26 to receive a corresponding one of the contacts 14, which will be described in greater detail hereinbelow.

Near the front of each of the sidewalls 42 there is provided a vertically extending ear 35 having a horizontal slot 36 formed in the front end thereof and terminating in a circular opening 38. Each of the openings 38 receives a corresponding one of a pair of pins 40, each of which extends horizontally and inwardly from a respective one of a pair of sidewalls 42 of the cover 18. Although the diameter of the pins 40 is slightly greater than the width of the slots 36, the resiliency of the ears 35 permits the pins 40 to be slid through the slots 36 and into the openings 38, thus providing direct engagement of base and cover bearing surfaces supportive of rotational movement of the base with respect to the cover.

Each sidewall 20 of the base 16 includes a curved leg 44 extending downwardly and rearwardly from the sidewall 20. As shown in FIGS. 2 and 3, each of the legs 44 projects through a corresponding one of a pair of openings 46 extending through a printed circuit board 48 between its upper surface 50 and its lower surface 52. A knee portion 54 of each of the legs 44 may be designed and dimensioned so as to positively engage a rear edge 56 of a corresponding opening 46. The upper surface of the free end of each of the legs 44 has a lug 58 which makes physical contact with the lower surface 52 of the printed circuit board 48.

Each sidewall 42 of the cover 18 includes a curved leg 60 integral therewith. When the cover 18 is in its open position, as shown in FIG. 1, the legs 60 are positioned above the upper surface 50 of the printed circuit board 48. Upon the counterclockwise pivoting of the cover 18 toward its closed position, as shown in FIGS. 2 and 3, each of the legs 60 rotates in the same directional angle as cover 18 and passes through a corresponding one of the openings 46 until a lug 62 on the upper surface of the free end of each leg 60 engages the lower surface 52 of the printed circuit board 48. A knee portion 64 of each leg 60 can be designed and dimensioned so as to engage a front edge 66 of a corresponding one of the openings 46.

Except for the two partitions 24 located adjacent to the sidewalls 20 of the base 16, each of the partitions 24 is provided on the front of its pointed upper edge 67 with a nipple 68. When the cover 18 is in its closed position, each of the nipples 68 releasably engages a corresponding one of a plurality of holes 70 formed in a back face 72 of the cover 18 to prevent its inadvertent opening.

Referring now to FIGS. 1-5, the contacts shown therein include a flat elongated body 74, the rear end of which is bent to form a deflectable shoe 76 adapted for engagement with a surface conductor (not shown) on the upper surface 50 of the printed circuit board 48. An upstanding bridge 78 extends vertically from the body 74 of the contact 14 intermediate the ends thereof. The bridge 78 includes a pair of towers 80, 82 each of which is cantilevered to an edge of the body 74 by a strut 84. The front tower 80 includes a front wall 86 with a vertical insulation-displacing slot 88 formed in the upper edge thereof and a rear wall 90 having a vertical insulation-displacing slot 92 provided in the upper edge thereof. Similarly, the rear tower 82 has a front wall 94 with a vertical insulation-displacing slot 96 provided in the upper edge thereof and a rear wall 98 including a vertical insulation-displacing slot 100 formed in the upper edge thereof.

Figure 4:
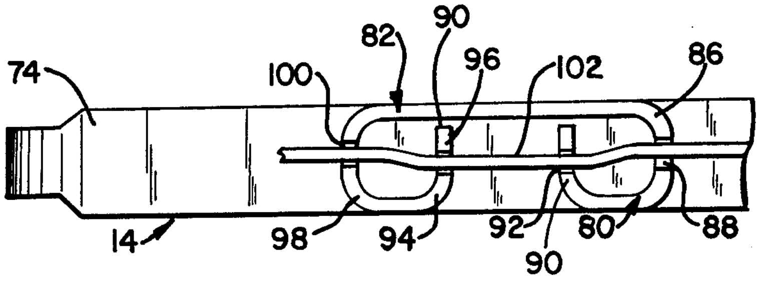
FIG. 4 is a plan view of the contact illustrated in FIGS. 1-3.
Figure 5:
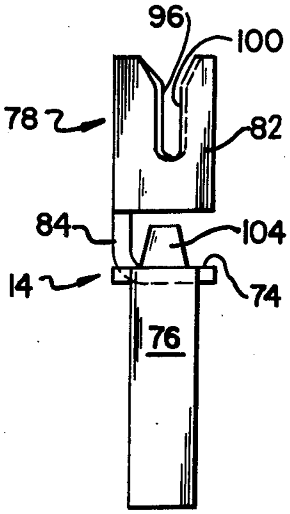
FIG. 5 is a back elevational view of the contact shown in FIG. 4.

The slots 88 and 92 are offset laterally with respect to each other (see FIG. 4). Similarly, the slot 96 is offset laterally with respect to the slot 100 (see FIGS. 4 and 5). However, the slots 88, 100 are laterally aligned with each other, as are the slots 92, 96. The walls 90, 94 are resiliently cantilevered to the walls 86, 98, respectively, so that when an electric cable 102 (see FIG. 4) is inserted into the slots 88, 92, 96, 100 by a suitable tool the slots 92, 96 are forced into alignment with the slots 88, 100. However, when the tool is removed, the resiliency of the walls 90, 94 causes them to revert back to their original position with respect to the walls 86, 98, respectively. With the walls 90, 94 in their original positions, the slots 92, 96 reassume their offset relationship with respect to the slots 88, 100 respectively, thereby bending the cable 102 so that it follows a tortuous path defined by the slots and symmetrical with respect to a plane arranged perpendicular to the body 74 and containing a lateral axis thereof and tensioning the cable 102 to inhibit the undesired elongation of its radial cross section along the longitudinal axes of the slots. The upper end of each of the slots 88, 92, 96, 100 may be flared (as shown) to facilitate the insertion of the cable 102 thereinto.

Between the bridge 78 and the front end of the body 74 there is provided a locking tang 104 which is attached at its front end to the upper surface of the body 74 and extends upwardly therefrom at a predetermined angle. The tang 104 is deflectable, so that upon insertion of the contact 14 into a corresponding one of the channels 26 in the connector 12 the tang 104 is deflected downward by the dividing wall 28 to permit the complete insertion of the contact 14. When the tang 104 reaches a chamber 106 located behind the front wall 22 of the base 16, the tang 104 automatically reassumes its predetermined angle which is selected to permit the tang 104 to engage a rear wall 108 of the chamber 106 for inhibiting the inadvertent removal of the contact 14.

During the insertion of the contact 14, the strut 84 passes through the slot 34 in the dividing wall 28 with the towers 80, 82 being received in the upper channel 30 and the body 74 being received in the lower channel 32. The insertion of the contact 14 also causes the deflection of the shoe 76 (see FIG. 3), thereby forcing the upper surface of the body 74 into engagement with the lower surface of the dividing wall 28 and urging the base 16 away from the upper surface 50 of the printed circuit board 48. The force exerted by the shoe 76 on the upper surface 50 of the printed circuit board 48 enhances the quality of the electrical connection between the shoe 76 and the surface conductor (not shown) of the printed circuit board 48. To facilitate insertion of the contact 14, the distance between the rear wall 108 of the chamber 106 and the front wall 22 of the base 16 is greater than the length of the portion of the contact 14 extending from a point directly below the free end of the tang 104 to the front end of the body 74. If it is desired to remove the contact 14 from the connector 12, a suitable device can be inserted into the chamber 106 through a corresponding opening 111 formed in the front wall 22 of the base 16 to deflect the tang 104 downward and out of engagement with the rear wall 108 of the chamber 106. Prior to the attachment of the connector 12 to the printed circuit board 48, the bridge 78 engages the dividing wall 28 to prevent the contact 14 from dropping out of the connector 12.

Each of the contacts 14 can receive a separate insulated electrical cable. The contacts 14 are also adapted for use with a ribbon cable having a plurality of individual spaced-apart electrical cables arranged side-by-side and wrapped in a single layer of electric-insulating material. When a ribbon cable is employed, the pointed upper edges 67 of the partitions 24 cut the webs of electric-insulating material separating adjacent cables to permit insertion of each of the cables into the slots 88, 92, 96, 100 of a corresponding contact 14.

When the cover 18 of the connector 12 is closed, its back face 72 blocks only a portion of the rear end of each of the upper channels 30, so that electrical cables can pass under the back face 72 and into the upper channels 30. An opening 113 provided in the front end of the cover 18 permits the passage of the electrical cables into the upper channels 30. Thus, regardless of the type of cables used, the contacts 14 can be electrically connected to the cables intermediate the ends thereof.

The connector 12 can be mounted to the upper surface 50 of the printed circuit board 48 by inserting the legs 44 through the centers of the corresponding openings 46 and then sliding the connector 12 rearwardly until the knee portions 54 of the legs 44 engage the rear edges 56 of the openings 46, thereby causing deflection of the shoes 76 which, in their deflected position, tend to raise the front end of the base 16 off of the upper surface 50 of the printed circuit board 48. To lock the connector 12 in place, the base 16 is pushed downwardly until its front end engages the upper surface 50 of the printed circuit board 48 and then the cover 18 is pivoted in a counterclockwise direction until it reaches its closed position in which the lugs 62 on the legs 60 engage the lower surface 52 of the printed circuit board 48. Due to the resiliency of the legs 44, 60, the connector 12 tends to compensate for board thickness tolerances and board warpage.

The connector 12 can be removed from the printed circuit board 48 by pivoting the cover 18 in a clockwise direction until the lugs 62 disengage the lower surface 52 of the printed circuit board 48 and the legs 60 clear the edge 66 of the opening 46. The connector 12 can then be slid forward to disengage the lugs 58 from the lower surface 52 of the printed circuit board 48 and retract the legs 44 through the openings 46.

Figure 6:
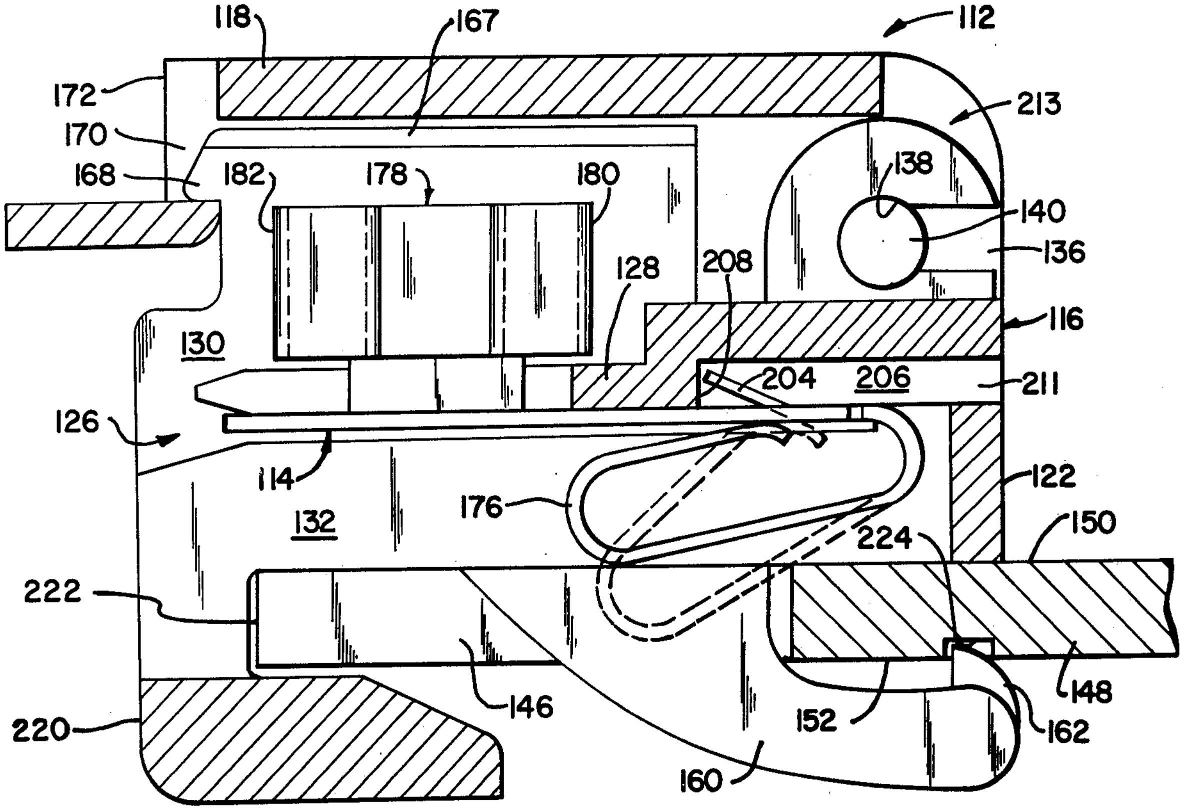
FIG. 6 is a longitudinal cross-sectional view of an alternate embodiment of the connector and contact assembly of the present invention.

Referring now to FIG. 6, there is shown a further embodiment of the present invention. The various elements illustrated in FIG. 6 which correspond to elements described above with respect to FIGS. 1–5 have been designated by corresponding reference numerals, increased by 100. Unless otherwise stated, the further embodiment operates in the same manner as the embodiment of FIGS. 1–5.

The embodiment of FIG. 6 utilizes a base 116 having an L-shaped leg 220 which depends from the base 116 and extends toward a front wall 122 thereof. The leg 220, which replaces the legs 42 of the embodiment illustrated in FIGS. 1–5, is positioned and dimensioned so as to engage an exterior edge 222 of a printed circuit board 148. A lug 162 is arranged on the upper surface of the free end of each of the legs 160 so as to register with a corresponding depression 224 formed in the lower surface 152 of the printed circuit board 148 for the purpose of positively locking the connector 112 in a fixed position. A contact 114 has a deflectable shoe 176 which is formed at the front end of the contact 114, instead of at its rear end. With the shoe 176 located in the front end of the base 116, the force applied to the rear end of the cover 118 for closing it will be sufficient to automatically lower the front end of the base 116 onto the upper surface 150 of the printed circuit board 148 during the closing operation.

It will be understood that the embodiments described herein are merely exemplary and that a person skilled in the art may make many variations and modifications without departing from the spirit and scope of the invention. For instance, any number of plural slots can be employed. All such modifications and variations are intended to be included within the scope of the invention as defined in the appended claims.

We claim:

1. A housing mountable on one side of a printed circuit board, comprising:

a base having first leg means depending therefrom and extending from said one side of the printed circuit board to the opposite side thereof for engaging said opposite side of said printed circuit board; and a cover pivotally mounted on said base and having second leg means depending from said cover and movable through the same rotational angle as said cover on cover pivotal movement, said second leg means thereby being movable through an opening extending from said one side of said printed circuit board to said other side thereof in response to the movement of said cover for releasably engaging said opposite side of said printed circuit board, said second leg means cooperating with said first leg means to removably mount said connector in a fixed position on said one side of said printed circuit board.

2. A housing according to claim 1, wherein said cover is pivotable between a first position in which said cover is substantially perpendicular to said base and a second position in which said cover is substantially parallel to said base, said second leg means releasably engaging said opposite side of said printed circuit board when said cover is in said second position.

3. A housing according to claim 2, further comprising catch means for releasably maintaining said cover in said second position to inhibit the inadvertent disengagement of said second leg means from said opposite side of said printed circuit board.

4. A housing according to claim 3, wherein said catch means includes a male connector means on said base and a female connector means on said cover for releasably receiving said male connector means.

5. A housing according to claim 4, wherein said female connector means is a plurality of holes in said cover and said male connector means is a plurality of resilient nipples on said base, each of said nipples releasably engaging a corresponding one of said holes.

6. A housing according to claim 2, wherein said cover is pivotal about a pivot axis located generally at one end of said base.

7. A housing according to claim 6, wherein said second leg means is a first pair of arcuate hooks arranged a distance from said pivot axis of said cover, the free end of each of the hooks extending toward said one end of said base when said cover is in said second position, each of said hooks being movable through a corresponding one of a pair of openings in said printed circuit board.

8. A housing according to claim 7, wherein said first leg means is a second pair of arcuate hooks, the free end of each of the hooks of said second pair of hooks extending toward the opposite end of said base, each of said hooks of said second pair of hooks extending through a corresponding one of said pair of openings together with a respective one of said hooks of said first pair of hooks.

9. A housing according to claim 8, wherein a portion of each of said hooks of said first pair of hooks remote from said free end thereof is engagable with one edge of a corresponding one of said pair of openings and a portion of each of said hooks of said second pair of hooks remote from said free end thereof is engagable with the opposite edge of a corresponding one of said pair of openings.

10. A housing according to claim 8, wherein each of said hooks of said first and second pairs of hooks includes a lug arranged so as to engage said opposite side of said printed circuit board.

11. A housing according to claim 7, wherein said first leg means is an L-shaped hook, the free end of which extends toward said one end of said base, said L-shaped hook being designed for attachment to an edge of said printed circuit board.

12. A housing according to claim 11, wherein each of said hooks of said first pair of hooks includes a lug engagable with said opposite side of said printed circuit board.

13. A housing according to claim 1, wherein said base includes a plurality of channels arranged thereacross and a plurality of contacts, each of said contacts being removably received in a corresponding one of said channels and including a plurality of insulation-displacing slots arranged successively along said contact, each of said slots being offset with respect to at least one adjacent slot.

14. A housing according to claim 13, wherein each of said contacts includes a deflectable shoe interposed between said base and said printed circuit board for urging said base away from said one side of said printed circuit board when said shoe is deflected.

15. The housing claimed in claim 1 wherein said second leg means is an integrally dependent portion of said cover.

16. A housing mountable on one side of a printed circuit board comprising:

a base defining a first bearing surface and having dependent leg means extending from one side of said printed circuit board to the opposite side thereof for engaging said opposite side; and a cover defining a second bearing surface directly engaged with said first bearing surface for supporting relative movement of said cover with respect to said base, said cover having integrally dependent leg means movable on cover movement relative to said base, such cover leg means thereby being movable through an opening in said printed circuit board into engaging relation with said printed circuit board opposite side, such base leg means and said cover leg means thereby cooperatively mounting said housing.

17. A housing mountable on one side of a printed circuit board comprising:

a base defining a first bearing surface and having dependent leg means extending from one side of said printed circuit board through an opening in said board toward the opposite side thereof for engaging an edge of said opening; and a cover defining a second bearing surface directly engaged with said first bearing surface for supporting relative movement of said cover with respect to said base, said cover having integrally dependent leg means movable on cover movement relative to said base, such cover leg means thereby being movable through said opening in said printed circuit board into engaging relation with another edge of said printed circuit board opening, such base leg means and said cover leg means thereby cooperatively mounting said housing.

* * * * *